US008455876B2

(12) United States Patent
Choi et al.

(10) Patent No.: US 8,455,876 B2
(45) Date of Patent: Jun. 4, 2013

(54) ORGANIC LIGHT EMITTING DIODE DISPLAY AND METHOD OF MANUFACTURING THE SAME

(75) Inventors: Jong-Hyun Choi, Yongin (KR);
June-Woo Lee, Yongin (KR);
Kwang-Hae Kim, Yongin (KR);
Kyoung-Bo Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 306 days.

(21) Appl. No.: 12/805,702

(22) Filed: Aug. 16, 2010

(65) Prior Publication Data

US 2011/0049523 A1    Mar. 3, 2011

(30) Foreign Application Priority Data

Aug. 25, 2009 (KR) ................ 10-2009-0078946

(51) Int. Cl.
*H01L 33/16* (2010.01)
*H01L 29/786* (2006.01)
(52) U.S. Cl.
USPC ........ 257/72; 438/29; 438/164; 257/E29.292; 257/E33.003
(58) Field of Classification Search
USPC ...................... 257/72; 438/29, 164
See application file for complete search history.

(56) References Cited

U.S. PATENT DOCUMENTS 7,358,528 B2    4/2008 Kim et al.
7,825,406 B2 *  11/2010 Yoshida et al. ................. 257/40
2003/0038289 A1 *   2/2003 Yamazaki et al. ............... 257/72
2005/0012152 A1     1/2005 Park et al.
2005/0176194 A1 *   8/2005 Sasaki et al. .................... 438/197
2006/0273348 A1 *  12/2006 Yoshinaga et al. ............ 257/192
2008/0073654 A1 *   3/2008 Miyake et al. .................. 257/79

FOREIGN PATENT DOCUMENTS

| JP | 2000-276076 A | 10/2000 |
| JP | 2002-050768 A | 2/2002 |
| JP | 2008-300612 A | 12/2008 |
| JP | 2009-540623 A | 11/2009 |
| KR | 10-2005-0003249 A | 1/2005 |
| KR | 10-2005-0003258 A | 1/2005 |
| KR | 10-2005-0011602 A | 1/2005 |
| KR | 10 2005-0067055 A | 6/2005 |
| KR | 10-2006-0075586 A | 7/2006 |
| KR | 10-2006-0075587 A | 7/2006 |

* cited by examiner

*Primary Examiner* — Steven J Fulk
(74) *Attorney, Agent, or Firm* — Lee & Morse, P.C.

(57) ABSTRACT

An OLED display including a substrate main body; a first gate electrode and a second semiconductor layer; a gate insulating layer on the first gate electrode and the second semiconductor layer; a first semiconductor layer and a second gate electrode overlying the first gate electrode and the second semiconductor layer, respectively; etching stopper layers contacting portions of the first semiconductor layer; an interlayer insulating layer on the first semiconductor layer and the second gate electrode and including contact holes exposing the plurality of etching stopper layers, respectively; a first source electrode and a first drain electrode on the interlayer insulating layer and the contact holes being indirectly connected to the first semiconductor layer via the etching stopper layers or directly connected to the first semiconductor layer; and a second source electrode and a second drain electrode on the interlayer insulating layer being connected to the second semiconductor layer.

24 Claims, 11 Drawing Sheets

ORGANIC LIGHT EMITTING DIODE DISPLAY AND METHOD OF MANUFACTURING THE SAME

BACKGROUND

1. Field

Embodiments relate to an organic light emitting diode display and a method of manufacturing the same.

2. Description of the Related Art

An organic light emitting diode (OLED) display is a self emissive display device that displays images with organic light emitting diodes. The organic light emitting diode display differs from a liquid crystal display (LCD) in that it does not require a separate light source, and may have a relatively small thickness and light weight. Furthermore, as the organic light emitting diode display exhibits high quality characteristics, e.g., low power consumption, high luminance, and short response time, it is spotlighted as a next generation display device for portable electronic devices.

Recently, attention has been particularly drawn to an organic light emitting diode display with oxide thin film transistors. An oxide thin film transistor is an oxide semiconductor-based thin film transistor. The oxide thin film transistor may have higher electron mobility and reliability than an amorphous silicon-based thin film transistor and may exhibit excellent overall performance characteristics. Thus, the organic light emitting diode display with such oxide thin film transistors may be advantageous in constructing a transparent display device.

Compared with a polycrystalline silicon-based thin film transistor, while the oxide thin film transistor may exhibit excellent uniformity, it may fall behind in electron mobility. Accordingly, if the organic light emitting diode display is formed with only the oxide thin film transistors, it may be limited in overall capacity.

The above information disclosed in this Background section is only for enhancement of understanding of the background of the described technology and therefore it may contain information that does not form the prior art that is already known in this country to a person of ordinary skill in the art.

SUMMARY

Embodiments are directed to an organic light emitting diode display and a method of manufacturing the same, which represent advances over the related art.

It is a feature of an embodiment to provide an organic light emitting diode display capable of stably using an oxide semiconductor layer and a polycrystalline silicon semiconductor layer with a relatively simple structure.

It is another feature of an embodiment to provide a method of manufacturing an organic light emitting diode display in a simple and effective manner.

At least one of the above and other features and advantages may be realized by providing an organic light emitting diode display including a substrate main body; a first gate electrode and a second semiconductor layer on the substrate main body; a gate insulating layer on the first gate electrode and the second semiconductor layer; a first semiconductor layer and a second gate electrode on the gate insulating layer, the first semiconductor layer overlying the first gate electrode and the second gate electrode overlying the second semiconductor layer; a plurality of etching stopper layers, the plurality of etching stopper layers contacting portions of the first semiconductor layer; an interlayer insulating layer on the first semiconductor layer and the second gate electrode, the interlayer insulating layer including a plurality of contact holes exposing the plurality of etching stopper layers, respectively; a first source electrode and a first drain electrode on the interlayer insulating layer and the contact holes, the first source electrode and the first drain electrode being indirectly connected to the first semiconductor layer via the plurality of etching stopper layers or directly connected to the first semiconductor layer; and a second source electrode and a second drain electrode on the interlayer insulating layer, the second source electrode and the second drain electrode being connected to the second semiconductor layer.

The first semiconductor layer may be an oxide semiconductor layer.

The etching stopper layers may be disposed external to the first semiconductor layer.

The second semiconductor layer may include a channel region under the second gate electrode, and source and drain regions at respective sides of the channel region.

The channel region of the second semiconductor layer may include a non-doped polycrystalline silicon layer, and the source and drain regions of the second semiconductor layer may include an impurity-doped polycrystalline silicon layer.

The first gate electrode may include the same material as, and may be disposed in the same plane as, the source and drain regions of the second semiconductor layer.

The interlayer insulating layer and the gate insulating layer may further include additional contact holes, the additional contact holes partially exposing the source and drain regions of the second semiconductor layer; and the second source electrode and second drain electrode may be disposed in respective additional contact holes.

The etching stopper layers may be disposed directly on portions of the first semiconductor layer.

The second gate electrode may include a first electrode layer, the first electrode layer including the same material as the first semiconductor layer, and a second electrode layer, the second electrode layer including the same material as the etching stopper layer.

Portions of the first semiconductor layer may be disposed directly on portions of the etching stopper layers.

The second gate electrode may include the same material as the etching stopper layers.

At least one of the above and other features and advantages may also be realized by providing a method of manufacturing an organic light emitting diode display, the method including forming a first gate electrode precursor and a second semiconductor layer precursor on a substrate main body such that the first gate electrode precursor and the second semiconductor layer each include a polycrystalline silicon layer; forming a gate insulating layer on the first gate electrode precursor and the second semiconductor layer precursor; sequentially forming an oxide semiconductor layer and a metallic layer on the gate insulating layer; patterning the oxide semiconductor layer and the metallic layer to form a second gate electrode, a first semiconductor layer, and a plurality of etching stopper layers such that the plurality of etching stopper layers are disposed directly on portions of the first semiconductor layer; doping impurities into the first gate electrode precursor and the second semiconductor layer precursor to form a first gate electrode and a second semiconductor layer; forming an interlayer insulating layer on the second gate electrode, the first semiconductor layer, and the etching stopper layers; etching the interlayer insulating layer to form a first source contact hole and a first drain contact hole exposing the plurality of etching stopper layers, respectively; and etching the interlayer insulating layer and the gate insulating layer together to form a second source contact hole and a second drain contact hole partially exposing the second semiconductor layer.

The method may further include forming a first source electrode, a first drain electrode, a second source electrode, and a second drain electrode on the interlayer insulating layer, and wherein the first source electrode and the first drain electrode may be directly connected to the first semiconductor layer via the first source and first drain contact holes or indirectly connected to the first semiconductor layer via the etching stopper layers, and the second source electrode and the second drain electrode may be connected to the second semiconductor layer through the second source contact hole and the second drain contact hole, respectively.

The etching stopper layers may be disposed external to the first semiconductor layer.

The second semiconductor layer may include a channel region, the channel region being disposed under the second gate electrode, and source and drain regions, the source and drain regions being disposed at respective sides of the channel region.

The channel region of the second semiconductor layer may include a non-doped polycrystalline silicon layer and the source and drain regions of the second semiconductor layer may include an impurity-doped polycrystalline silicon layer.

The first gate electrode may be formed in the same way as, in the same plane as, and of the same material as the source and drain regions of the second semiconductor layer.

The second gate electrode may include a double-layered structure formed from the oxide semiconductor layer and the metallic layer, wherein the first semiconductor layer may be formed from the oxide semiconductor layer, and wherein the etching stopper layers may be formed from the metallic layer.

At least one of the above and other features and advantages may also be realized by providing a method of manufacturing an organic light emitting diode display, the method including forming a first gate electrode precursor and a second semiconductor layer precursor on a substrate main body such that the first gate electrode precursor and second semiconductor layer precursor include a polycrystalline silicon layer; forming a gate insulating layer on the first gate electrode precursor and the second semiconductor layer precursor; forming a metallic layer on the gate insulating layer; patterning the metallic layer to form a second gate electrode and a plurality of etching stopper layers; doping impurities into the first gate electrode precursor and the second semiconductor layer precursor to form a first gate electrode and a second semiconductor layer; forming an oxide semiconductor layer on the plurality of etching stopper layers; patterning the oxide semiconductor layer to form a first semiconductor layer such that portions of the first semiconductor layer at least partially overlie portions of the etching stopper layers; forming an interlayer insulating layer on the second gate electrode, the etching stopper layers, and the first semiconductor layer; etching the interlayer insulating layer to form a first source contact hole and a first drain contact hole such that the first source contact hole and the first drain contact hole expose the plurality of etching stopper layers, respectively; and etching the interlayer insulating layer and the gate insulating layer together to form a second source contact hole and a second drain contact hole such that the second source contact hole and a second drain contact hole partially expose the second semiconductor layer.

The method may further include forming a first source electrode, a first drain electrode, a second source electrode, and a second drain electrode on the interlayer insulating layer, and wherein the first source electrode and the first drain electrode may be directly connected to the first semiconductor layer via the first source and first drain contact holes or indirectly connected to the first semiconductor layer via the etching stopper layers, and the second source electrode and the second drain electrode may be connected to the second semiconductor layer through the second source contact hole and the second drain contact hole, respectively.

The etching stopper layers may be disposed external to the first semiconductor layer.

The second semiconductor layer may include a channel region, the channel region being disposed under the second gate electrode, and source and drain regions, the source and drain regions being disposed at respective sides of the channel region.

The channel region of the second semiconductor layer may include a non-doped polycrystalline silicon layer and the source and drain regions of the second semiconductor layer may include an impurity-doped polycrystalline silicon layer.

The first gate electrode may be formed in the same way as, in the same plane as, and of the same material as the source and drain regions of the second semiconductor layer.

The second gate electrode may include a double-layered structure formed from the oxide semiconductor layer and the metallic layer, wherein the first semiconductor layer may be formed from the oxide semiconductor layer, and wherein the etching stopper layers may be formed from the metallic layer.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
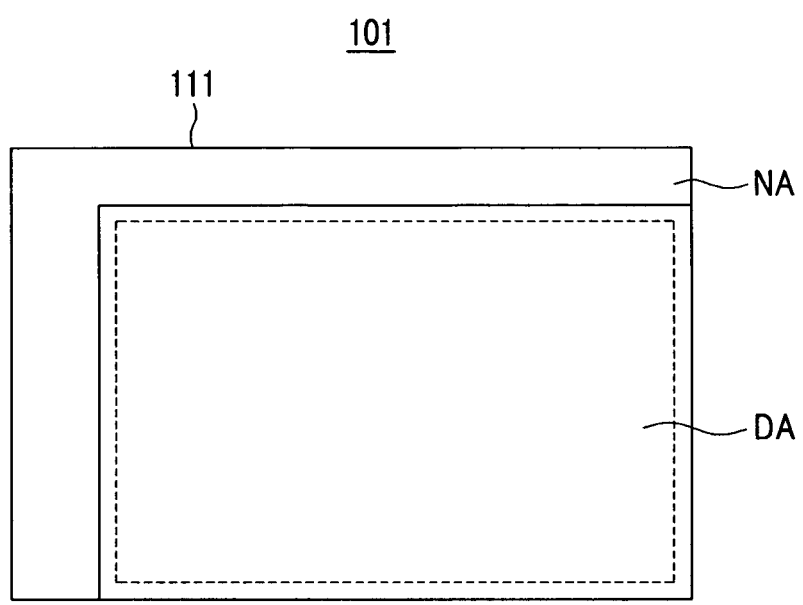
FIG. 1 illustrates a schematic plan view of an organic light emitting diode display according to an embodiment.

Korean Patent Application No. 10-2009-0078946, filed on Aug. 25, 2009, in the Korean Intellectual Property Office, and entitled: "Organic Light Emitting Diode Display and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" or "overlying" or being such as to "overlie" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Furthermore, with the embodiments, detailed description is given for the constituent elements in a first embodiment with reference to the relevant drawings by using the same reference numerals for the same constituent elements, while only different constituent elements from those related to the first embodiment are described in other embodiments.

Parts that are irrelevant to the description may be omitted in order to clearly describe the embodiments Furthermore, as the size and thickness of the respective structural components shown in the drawings are arbitrarily illustrated for explanatory convenience, the embodiments are not necessarily limited to as illustrated.

An organic light emitting diode display according to an embodiment will now be described with reference to FIG. 1 to FIG. 3.

As illustrated in FIG. 1, an organic light emitting diode display 101 according to an embodiment may include a substrate main body 111 including, e.g., a display area DA and a non-display area NA. A plurality of pixels PE illustrated in FIG. 2 may be formed at the display area DA of the substrate main body 111 so as to display images. Several driving circuits may be formed at the non-display area NA.

Figure 2:
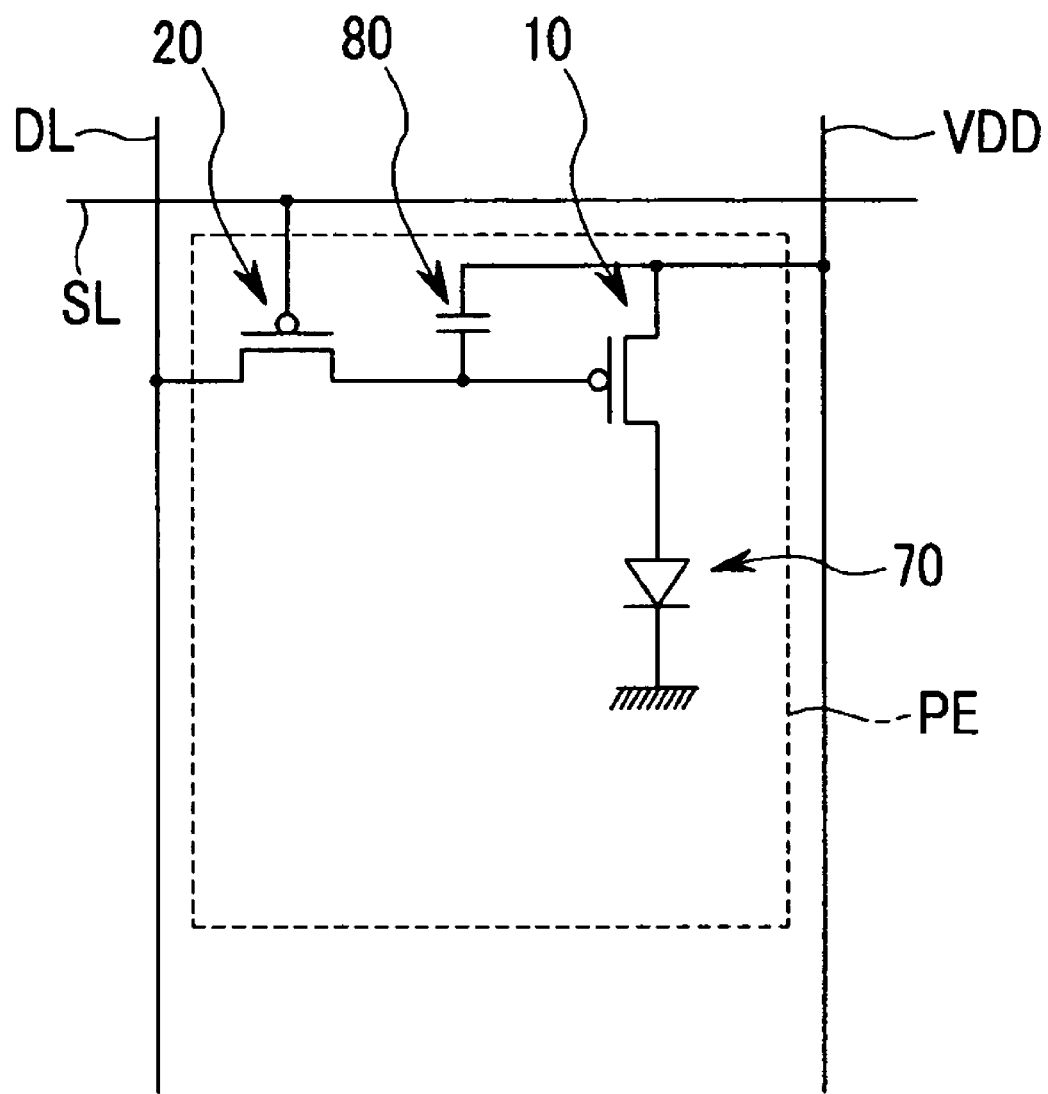
FIG. 2 illustrates a circuit diagram of a pixel of the organic light emitting diode display of FIG. 1.

As illustrated in FIG. 2, a pixel PE of the organic light emitting diode display 101 may have, e.g., a 2Tr-1Cap structure with an organic light emitting diode 70, two thin film transistors (TFTs) 10 and 20, and a capacitor 80. However, the embodiments are not limited thereto. Thus, in the organic light emitting diode display 101, a pixel PE may include, e.g., three or more thin film transistors and two or more capacitors, and a separate wire may be formed thereat while being varied in structure. In this way, the additional thin film transistors and the capacitors may form a compensating circuit.

A compensating circuit may improve uniformity of the organic light emitting diode 70 of each pixel PE so as to, e.g., prevent image quality from being uneven. The compensating circuit may include, e.g., about four to about eight thin film transistors.

Furthermore, a driving circuit of the non-display area NA of the substrate main body 111 may include additional thin film transistors.

The organic light emitting diode 70 may include, e.g., an anode being a hole injection electrode, a cathode being an electron injection electrode, and an organic emissive layer disposed between the anode and the cathode.

The two thin film transistors according to an embodiment may include first and second thin film transistors 10 and 20.

The first and second thin film transistors 10 and 20 may include, e.g., a gate electrode, a semiconductor layer, a source electrode, and a drain electrode, respectively. The semiconductor layer of the first thin film transistor 10 may be an oxide semiconductor layer and the semiconductor layer of the second thin film transistor 20 may be a polycrystalline silicon semiconductor layer. In other words, the first thin film transistor 10 may be an oxide thin film transistor and the second thin film transistor 20 may be a polycrystalline silicon thin film transistor.

The first thin film transistor 10 may be connected to the organic light emitting diode 70. The second thin film transistor may be connected to a scan line SL and a data line DL.

The second thin film transistor 20 may be a switching TFT for selecting a pixel PE to be illuminated. The gate electrode of the second thin film transistor 20 may be connected to the scan line SL and the source electrode of the second thin film transistor 20 may be connected to the data line DL. The second thin film transistor 20 may transmit a data voltage input from the data line DL to the first thin film transistor 10 in accordance with a switching voltage input into the scan line SL.

The capacitor 80 may be connected to the second thin film transistor 20 and a common power line VDD. The capacitor 80 may store a voltage corresponding to a difference between a voltage transmitted from the second thin film transistor 20 and a voltage supplied to the common power line VDD.

The first thin film transistor 10 may supply driving power to the organic light emitting diode 70 within the selected pixel PE to drive it and thereby emit light. The gate electrode of the first thin film transistor 10 may be connected to a capacitor plate of the capacitor 80 connected to the drain electrode of the second thin film transistor 20. The source electrode of the first thin film transistor 10 and another capacitor plate of the capacitor 80 may be connected to the common power line VDD, respectively. Further, the drain electrode of the first thin film transistor 10 may be connected to the anode of the organic light emitting diode 70. In this way, the first thin film transistor 10 may be connected to the common power line VDD and the capacitor 80 so as to supply an output current $I_{OLED}$ to the organic light emitting diode 70. The output current $I_{OLED}$ may be proportional to a square of a difference between a voltage stored at the capacitor 80 and a threshold voltage. The organic light emitting diode 70 may emit light by way of the output current $I_{OLED}$ supplied from the first thin film transistor 10.

The structure of the pixel PE is not limited to as above-described, and may be altered in various manners.

Figure 3:
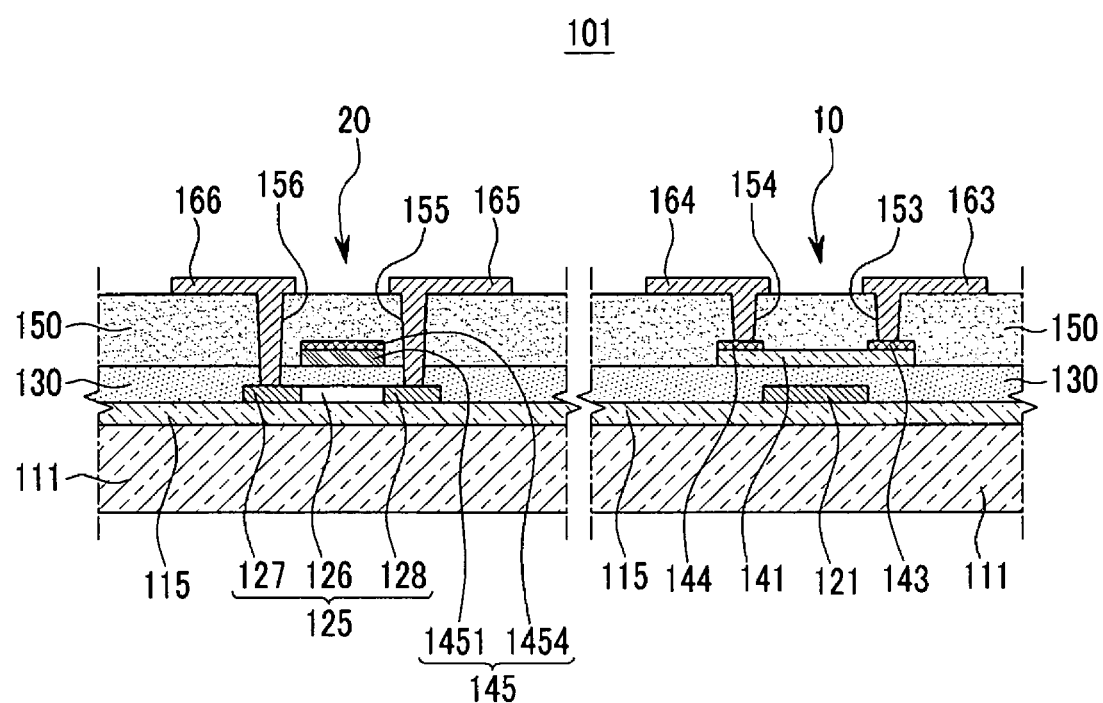
FIG. 3 illustrates an amplified partial sectional view of thin film transistors of the organic light emitting diode display of FIG. 1.

As illustrated in FIG. 3, the first thin film transistor 10 may include a first gate electrode 121, a first semiconductor layer 141, a first source electrode 163, and a first drain electrode 164. The second thin film transistor 20 may include a second gate electrode 145, a second semiconductor layer 125, a second source electrode 165, and a second drain electrode 166. The first semiconductor layer 141 may be an oxide semiconductor layer and the second semiconductor layer 125 may be a polycrystalline silicon semiconductor layer. Furthermore, the first thin film transistor 10 may include a plurality of etching stopper layers 143 and 144 contacting a portion of the first semiconductor layer 141.

The structure of the first and second thin film transistors 10 and 20 according to an embodiment will be described in detail with reference to FIG. 3.

The substrate main body 111 may include an insulating material, e.g., glass, quartz, ceramic, and/or plastic. However, the embodiments are not limited thereto, and the substrate main body 111 may be formed of a metallic material, e.g., stainless steel.

A buffer layer 115 may be disposed on the substrate main body 111. The buffer layer 115 may include, e.g., various inorganic and organic materials. The buffer layer 115 may flatten a surface while preventing intrusion of needless and/or damaging components, e.g., impure elements and/or moisture. However, it is not necessary to provide the buffer layer 115, and the buffer layer 115 may be omitted depending upon the kind and processing conditions of the substrate main body 111.

A first gate electrode 121 and a second semiconductor layer 125 may be formed on the buffer layer 115. In the absence of the buffer layer 115, the first gate electrode 121 and the second semiconductor layer 125 may be formed on the substrate main body 111.

The second semiconductor layer 125 may be demarcated into, e.g., a channel region 126 and source and drain regions 128 and 127 at respective sides of the channel region 126. The channel region 126 of the second semiconductor layer 125 may include, e.g., a non-doped polycrystalline silicon layer, that is, an intrinsic semiconductor. The source and drain regions 128 and 127 of the second semiconductor layer 125 may include, e.g., an impurity-doped polycrystalline silicon layer. The impurities doped at the source and the drain regions 128 and 127 of the second semiconductor layer 125 may be, e.g., P-type impurities. The P-type impurities may include, e.g., boron (B) ion-like materials. However, the embodiments are not limited to as above-described. Accordingly, the doped impurities may be, e.g., N-type impurities. The N-type impurities may include, e.g., phosphorous (P) ion-like materials.

The first gate electrode 121 may be formed in the same way as the source and drain regions 128 and 127 of the second semiconductor layer 125. That is, the first gate electrode 121 may include, e.g., an impurity-doped polycrystalline silicon layer. The first gate electrode 121 may be formed together with the source and drain regions 128 and 127 of the second semiconductor layer 125 such that the source and drain regions 128 and 127 may be disposed on the same plane as the first gate electrode 121.

A gate insulating layer 130 may be disposed on the first gate electrode 121 and the second semiconductor layer 125. The gate insulating layer 130 may include, e.g., silicon nitride ($SiN_x$) or silicon oxide ($SiO_x$). However, the material for the gate insulating layer 130 is not limited thereto.

The second gate electrode 145 and the first semiconductor layer 141 may be disposed on the gate insulating layer 130. Furthermore, the plurality of etching stopper layers 143 and 144 may be disposed directly on portions of the first semiconductor layer 141.

Portions of the first semiconductor layer 141 may overlie the first gate electrode 121. The first semiconductor layer 141 may include, e.g., an oxide semiconductor layer. In an implementation, the oxide semiconductor layer may include an oxide material including, e.g., oxygen (O) and at least one of gallium (Ga), indium (In), zinc (Zn), and tin (Sn). In another implementation, the first semiconductor layer 141 may include a mixture oxide, e.g., InZnO, InGaO, InSnO, ZnSnO, GaSnO, GaZnO, and GaInZnO.

The first thin film transistor 10 using an oxide semiconductor may have an effective mobility of charges that is about two times to about one hundred times greater than a thin film transistor using hydrogenated amorphous silicon and an on/off current ratio of about 105 to about 108. That is, the first thin film transistor 10 using the oxide semiconductor may exhibit comparatively excellent semiconductor characteristics. Also, in the case of the oxide semiconductor, as the band gap may be about 3.0 eV to about 3.5 eV, no leakage optical current with respect to visible light may be generated. Accordingly, momentary afterimages of the first thin film transistor 10 may be prevented. Furthermore, in order to improve characteristics of the first thin film transistor 10, the first semiconductor layer 141 may further include, e.g., elements of the third, fourth, or fifth group of the periodic table or transition elements.

The etching stopper layers 143 and 144 may include, e.g., a metal or a metal alloy. The metal and/or metal alloy may include, e.g., aluminum (Al), molybdenum (Mo), nickel (Ni), silver (Ag), chromium (Cr), titanium (Ti), and/or tantalum (Ta).

The second gate electrode 145 may overlie the channel region 126 of the second semiconductor layer 125. During formation of the second semiconductor layer 125, when impurities are doped into the source and drain regions 128 and 127 of the second semiconductor layer 125, the second gate electrode 145 may prevent the impurities from being doped into the channel region 126. The second gate electrode 145 may include, e.g., a first electrode layer 1451 formed from the same material as the first semiconductor layer 141, i.e., the oxide semiconductor, and a second electrode layer 1454 formed on the first electrode layer 1451 from the same material as the etching stopper layer 144, i.e., the metallic material. Such a configuration may allow the second electrode layer 1451 to be formed simultaneously with the first semiconductor layer 141 and the second electrode layer 1454 to be formed simultaneously with the etching stopper layer 144.

An interlayer insulating layer 150 may be disposed on the first semiconductor layer 141, the etching stopper layers 143 and 144, and the second gate electrode 145. The interlayer insulating layer 150 may include a first source contact hole 153 and a first drain contact hole 154 exposing the etching stopper layers 143 and 144, respectively. Furthermore, the interlayer insulating layer 150 and the gate insulating layer 130 may together include a second source contact hole 155 and a second drain contact hole 156 partially exposing a portion of the source and drain regions 128 and 127 of the second semiconductor layer 125, respectively. As with the gate insulating layer 130, the interlayer insulating layer 150 may include, e.g., silicon nitride ($SiN_x$) or silicon oxide ($SiO_x$), but it is not limited thereto.

A first source electrode 163, a first drain electrode 164, a second source electrode 165, and a second drain electrode 166 may be disposed on the interlayer insulating layer 150 and in the contact holes 153, 154, 155, and 156, respectively.

The first source electrode 163 and the first drain electrode 164 may be spaced apart from each other and may contact the plurality of etching stopper layers 143 and 144 through the first source contact hole 153 and the first drain contact hole 154. The first source electrode 163 and the first drain electrode 164 may be indirectly connected to the first semiconductor layer 141 via the etching stopper layers 143 and 144, respectively. In an implementation, the first source electrode 163 and the first drain electrode 164 may be electrically connected to the first semiconductor layer 141 through the electrically conductive etching stopper layers 143 and 144.

The second source electrode 165 and the second drain electrode 166 may be spaced apart from each other and may contact the source and drain regions 128 and 127 of the second semiconductor layer 125 through the second source contact hole 155 and the second drain contact hole 156, respectively.

The contact holes 153, 154, 155, and 156 may be formed by, e.g., etching the interlayer insulating layer 150 or by etching the interlayer insulating layer 150 and the gate insulating layer 130 together. In an implementation, the contact holes 153, 154, 155, and 156 may be formed during a single etching process. Specifically, the second source contact hole 155 and the second drain contact hole 156 may be formed by etching the interlayer insulating layer 150 and the gate insulating layer 130 together. The first source contact hole 153 and the first drain contact hole 154 may be formed by etching only the interlayer insulating layer 150. Accordingly, during the single process of etching the gate insulating layer 130 in order to complete the second source contact hole 155 and the second drain contact hole 156, the first source contact hole 153 and the second drain contact hole 154 may be continuously exposed to the etching solution even after they are completed. Due to the presence of the etching stopper layer 143 and 144, the first source contact hole 153 and the second drain contact hole 154 may not be needlessly deepened and other surrounding structural components may not be damaged. Thus, in the organic light emitting diode display 101 according to an embodiment, the etching stopper layers 143 and 144 formed together with the second gate electrode 145 without performing any separate processing steps may stably form the first source contact hole 153 and the first drain contact hole 154. That is, the etching stopper layers 143 and 144 make it possible to effectively control etching environments under which the respective contact holes 153, 154, 155, and 156 are formed.

The etching stopper layers 143 and 144 may be formed from a metallic material. The metallic material may have an etching selectivity with respect to the interlayer insulating layer 150 and the gate insulating layer 130, formed from, e.g., silicon nitride ($SiN_x$) or silicon oxide ($SiO_x$).

Furthermore, the plurality of etching stopper layers 143 and 144 may be disposed external to the first gate electrode 121. In other words, the etching stopper layers 143 and 144 may not overlie the first gate electrode 121.

As described above, in the organic light emitting diode display 101 according to the present embodiment, the oxide first thin film transistor 10 and the polycrystalline silicon second thin film transistor 20 may be stably used together with a relatively simple structure so as to enhance the overall performance characteristics in an effective manner.

That is, the organic light emitting diode display 101 may be simplified in overall structure such that the first semiconductor layer 141 and the etching stopper layers 143 and 144 of the first thin film transistor 10 and the second gate electrode 145 of the second thin film transistor 20 may be formed together, i.e., at the same time and of the same materials. In addition, the first gate electrode 121 of the first thin film transistor 10 and the second semiconductor layer 125 of the second thin film transistor 20 may be formed together. Furthermore, the organic light emitting diode display may be stably formed by way of the etching stopper layers 143 and 144. In particular, as described above, the etching stopper layers 143 and 144 may help ensure that the contact holes 153, 154, 155, and 156 may be formed by a single etching process, without damaging any components of the first TFT 10.

The first thin film transistor 10, which may be directly connected to the organic light emitting diode 70 to drive it, may be formed with an oxide thin film transistor having comparatively excellent uniformity. The second thin film transistor 20, which may be used for the driving circuit of the non-display area (NA) or the switching or compensating circuit of the pixel (PE), may be a polycrystalline silicon thin film transistor having comparatively excellent electron mobility.

Accordingly, in the organic light emitting diode display 101, performance characteristics of the thin film transistors, e.g., uniformity and electron mobility, may be improved together with stability and productivity.

Furthermore, the N-type first thin film transistor 10 and the P-type second thin film transistor 20 may be combined so as to form a CMOS thin film transistor used for the driving circuit.

A method of manufacturing an organic light emitting diode display 101 according to an embodiment will be described with reference to FIG. 4 to FIG. 7, based on the process of forming the first thin film transistor 10 and the second thin film transistor 20.

Figure 4:
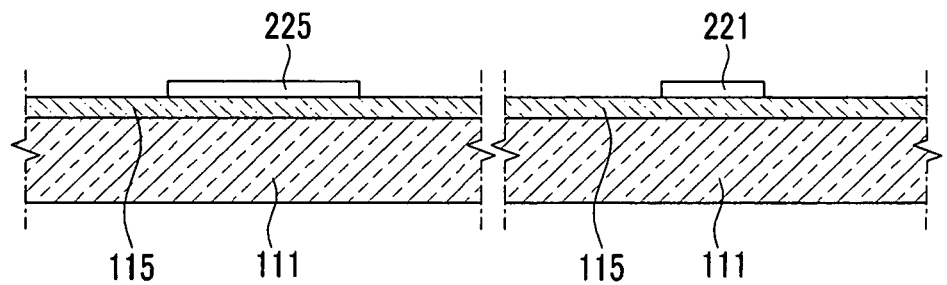
FIG. 4 to FIG. 7 illustrate cross-sectional views of stages in a method of manufacturing the thin film transistors of FIG. 3.

First, as illustrated in FIG. 4, a polycrystalline silicon layer may be formed on the substrate main body 111. The polycrystalline silicon layer may be formed by, e.g., forming an amorphous silicon layer and crystallizing the amorphous silicon layer. Various methods that are well known to a person of ordinary skill in the art may be used in order to crystallize the amorphous silicon layer. In an implementation, the amorphous silicon layer may be crystallized by, e.g., heat, a laser, Joule heat, an electric field, or a catalyst metal. A first gate electrode precursor 221 and a second semiconductor layer precursor 225 may be formed by patterning the polycrystalline silicon layer.

Figure 5:
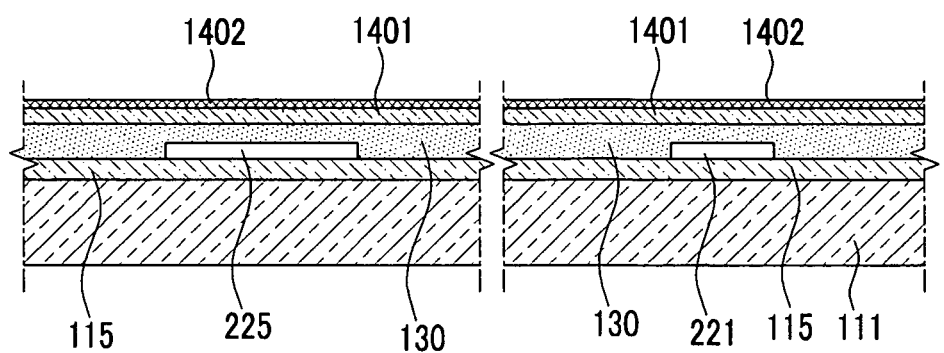

Then, as illustrated in FIG. 5, a gate insulating layer 130 may be formed on the first gate electrode precursor 221 and the second semiconductor layer precursor 225. The gate insulating layer 130 may include, e.g., silicon nitride ($SiN_x$) and/or silicon oxide ($SiO_x$).

Then, an oxide semiconductor layer 1401 and a metallic layer 1402 may be sequentially deposited onto the gate insulating layer 130. The oxide semiconductor layer 1401 and the metallic layer 1402 may be, e.g., continuously deposited under a vacuum atmosphere. By continuously depositing the oxide semiconductor layer 1401 and the metallic layer 1402, additionally process steps after the deposition of the oxide semiconductor layer 1401 and prior to the deposition of the metallic layer 1402 may be minimized, so that needless damage to the oxide semiconductor layer 1401 may be prevented.

The oxide semiconductor layer 1401 and/or the metallic layer 1402 may be deposited through, e.g., sputtering or evaporating an oxide semiconductor material or metal. In other words, the oxide semiconductor layer 1401 and/or the metallic layer 1402 may be deposited through various methods that are well known to a person of ordinary skill in the art, e.g., physical vapor deposition (PVD).

Figure 6:
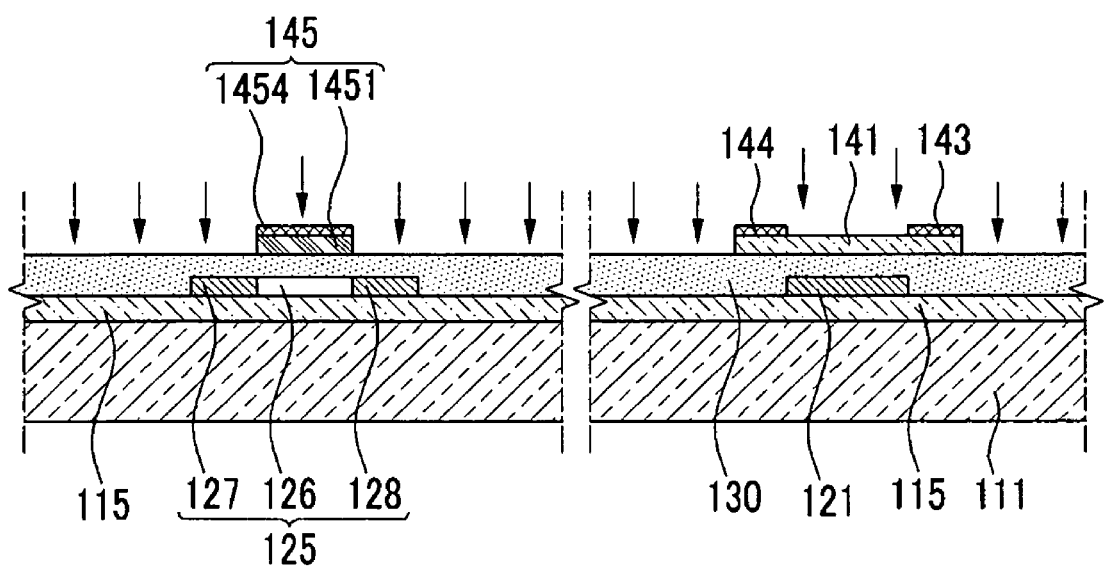

Then, as illustrated in FIG. 6, the deposited oxide semiconductor layer 1401 and metallic layer 1402 may be patterned through, e.g., an etching process, to thereby form a second gate electrode 145, a first semiconductor layer 141, and a plurality of etching stopper layers 143 and 144. In an implementation, the etching process may include, e.g., double exposure or halftone exposure.

A portion of the first semiconductor layer 141 may overlie the first gate electrode precursor 221. The plurality of etching stopper layers 143 and 144 may be formed on portions of the first semiconductor layer 141. Furthermore, the plurality of etching stopper layers 143 and 144 may be formed such that they are disposed external to, i.e., do not overlie, the first gate electrode precursor 221. It is preferable that the plurality of etching stoppers 143 and 144 do not overlie the first gate electrode precursor 221. This is because the etching stopper layers 143 and 144 may undesirably prohibit doping of impurities into the first gate electrode precursor 221 if the etching stopper layers 143 and 144 are in the path of the impurities.

The second gate electrode 145 may overlie a portion of the second semiconductor layer precursor 225. Furthermore, the second gate electrode 145 may include a first electrode layer 1451 formed by patterning the oxide semiconductor layer 1401 and a second electrode layer 1454 formed by patterning the metallic layer 1402.

Then, a first gate electrode 121 and a second semiconductor layer 125 may be formed by doping impurities into the first gate electrode precursor 221 and the second semiconductor layer precursor 225. The impurities may pass through the first semiconductor layer 141 and may be doped into the first gate electrode precursor 221. In contrast, as described above, the impurities may not pass through the etching stopper layers 143 and 144.

The second semiconductor layer 125 may be demarcated into, e.g., a channel region 126 where the doping of impurities is intercepted by the second gate electrode 145 and source and drain regions 128 and 127 at respective sides of the channel region 126 that are doped with impurities. The first gate electrode 121 may include, e.g., an impurity-doped polycrystalline silicon like the source and drain regions 128 and 127 of the second semiconductor layer 125. The arrows of FIG. 6 indicate the doping of impurities.

In an embodiment, the organic light emitting diode display 101 may be simplified in overall structure by using a conductive impurity-doped polycrystalline silicon layer as the first gate electrode 121. That is, the overall process of manufacturing the organic light emitting diode display 101 may be simplified by forming the first gate electrode 121 together with, i.e., simultaneously and of the same materials as, the second semiconductor layer 125, rather than separately forming them.

Figure 7:
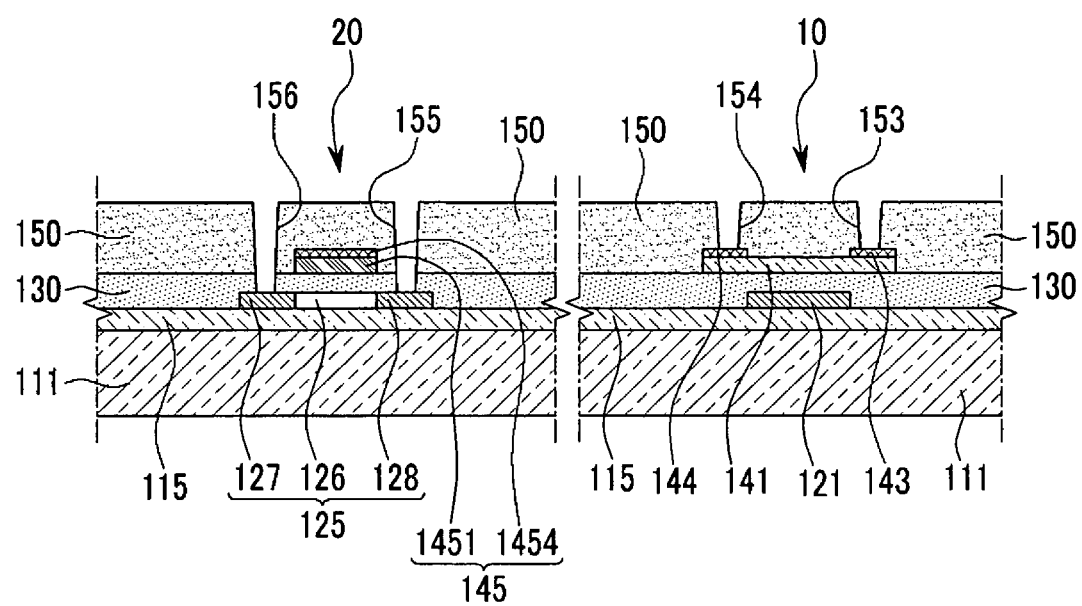

Then, as illustrated in FIG. 7, an interlayer insulating layer 150 may be formed on the first semiconductor layer 141, the etching stopper layers 143 and 144, and the second gate electrode 145. The interlayer insulating layer 150 may be etched to form a first source contact hole 153 and a first drain contact hole 154 partially exposing the plurality of etching stopper layers 143 and 144, respectively. Furthermore, the interlayer insulating layer 150 and the gate insulating layer 130 may be etched together to form a second source contact hole 155 and a second drain contact hole 156 partially exposing the source and drain regions 128 and 127 of the second semiconductor layer 125, respectively. In an implementation, the contact holes 153, 154, 155, and 156 may be formed by a single etching process.

As illustrated in FIG. 3, a first source electrode 163, a first drain electrode 164, a second source electrode 165, and a second drain electrode 166 may be formed on the interlayer insulating layer 150 and in the contact holes 153, 154, 155, and 156, respectively. The first source electrode 163 and the first drain electrode 164 may be indirectly connected to the first semiconductor layer 141 via the first source and first drain contact holes 153 and 154 and the etching stopper layers 143 and 144. In other words, the etching stopper layers 143 and 144 may be disposed between the first source and drain electrodes 163 and 164 and the first semiconductor layer 141 so as to electrically connect the electrodes 163 and 164 to the first semiconductor layer 141.

The second source electrode 165 and the second drain electrode 166 may be connected to the source and drain regions 128 and 127 of the second semiconductor layer 125 through the second source contact hole 155 and the second drain contact hole 156, respectively.

The organic light emitting diode display 101 of the present embodiment may be effectively manufactured by carrying out the above-described processes.

In the present embodiment, the oxide first thin film transistor 10 and the polycrystalline silicon second thin film transistor 20 may be formed in simple and effective manner.

In particular, the first gate electrode 121 of the first thin film transistor 10 and the second semiconductor layer 125 of the second thin film transistor 20 may be formed together, i.e., simultaneously and of the same material, on the same plane, so that the overall process of manufacturing the organic light emitting diode display 101 may be simplified.

Another embodiment will now be described with reference to FIG. 8.

Figure 8:
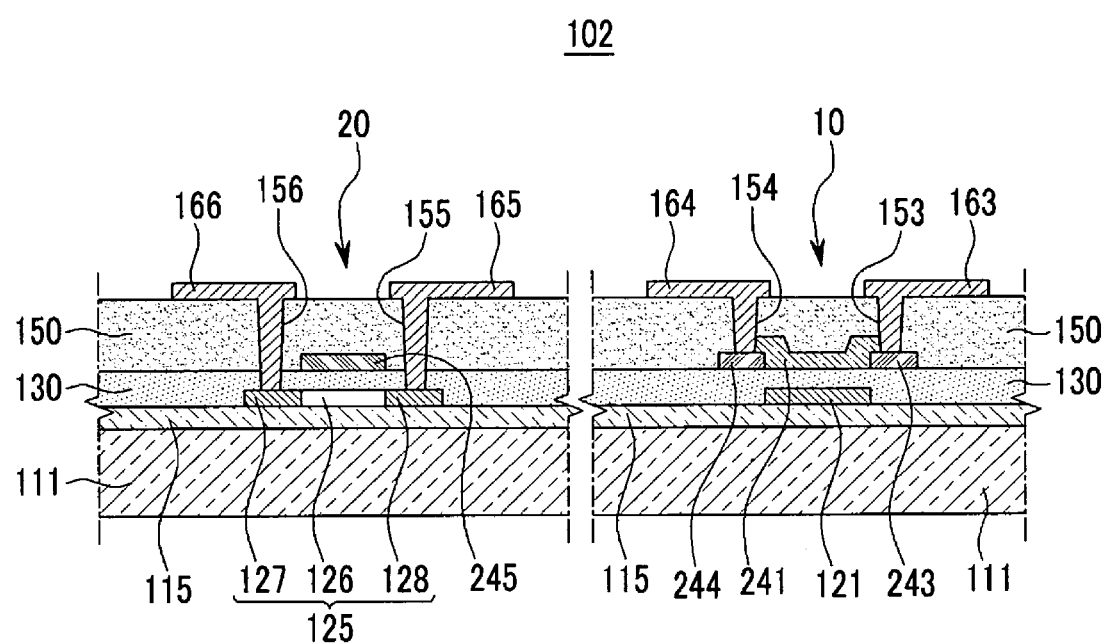
FIG. 8 illustrates an amplified partial sectional view of thin film transistors for an organic light emitting diode display according to another embodiment.

As illustrated in FIG. 8, in an organic light emitting diode display according to the present embodiment, portions of etching stopper layers 243 and 244 may be disposed directly under portions of a first semiconductor layer 241 of the first thin film transistor 10. Furthermore, the plurality of etching stopper layers 243 and 244 may be disposed external to, i.e., may not overlie, the first gate electrode 121.

The first source contact hole 153 and the first drain contact hole 154 of the interlayer insulating layer 150 may partially expose the plurality of etching stopper layers 243 and 244, respectively. That is, a portion of each of the etching stopper layers 243 and 244 that do not overlie the first semiconductor layer 241 may be exposed through the first source contact hole 153 and the first drain contact hole 154, respectively. The first source electrode 163 and the first drain electrode 164 may be connected to the first semiconductor layer 241 directly via the first source and first drain contact holes 153 and 154 and/or indirectly via the plurality of etching stopper layers 243 and 244.

The etching stopper layers 243 and 244 may include, e.g., a metal or a metal alloy. The metal or metal alloy may include, e.g., aluminum (Al), molybdenum (Mo), nickel (Ni), silver (Ag), chromium (Cr), titanium (Ti), and/or tantalum (Ta). That is, the etching stopper layers 243 and 244 may include, e.g., a metallic material that differs in etching selectivity from the interlayer insulating layer 150 and the gate insulating layer, which may include, e.g., silicon nitride ($SiN_x$) and/or silicon oxide ($SiO_x$).

Furthermore, the second gate electrode 245 may be formed on the same plane as the plurality of etching stopper layers 243 and 244 of the same material.

In this way, the etching stopper layers 243 and 244 according to the present embodiment may help ensure that the first source contact hole 153 and the first drain contact hole 154 are formed in a stable manner. That is, the plurality of etching stopper layers 243 and 244 may prevent the first source contact hole 153 and the first drain contact hole 154 from being needlessly deepened and/or structural components surrounding the holes 153 and 154 from being damaged. In particular, because the contact holes 153, 154, 155, and 156 may be formed by a single etching process, and the second contact holes 155 and 156 may be deeper than the first contact holes 153 and 154, the etching stopper layers 243 and 244 may protect, e.g., the first semiconductor layer 241, from damage during the etching process. This may allow for a simplified method of manufacturing due to the reduction of process steps.

Therefore, in the organic light emitting diode display 102 according to the present embodiment, the first oxide thin film transistor 10 and the polycrystalline silicon second thin film transistor 20 may be stably used together with a relatively simple structure so as to efficiently enhance overall performance characteristics.

A method of manufacturing the organic light emitting diode display 102 according to an embodiment will be now described with reference to FIG. 9 to FIG. 11, based on the differences from the previous embodiment.

Figure 9:
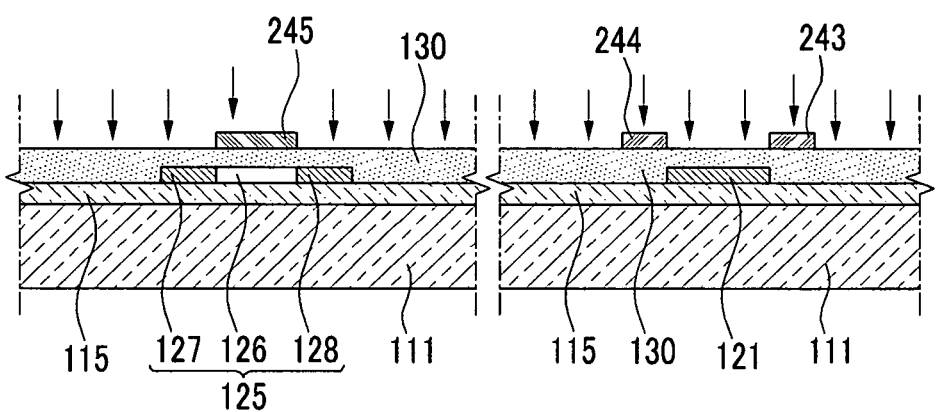
FIG. 9 to FIG. 11 illustrate cross-sectional views of stages in a method of manufacturing the thin film transistors of FIG. 8.

As illustrated in FIG. 9, a buffer layer 115 may be formed on the substrate main body 111, and a first gate electrode precursor and a second semiconductor layer precursor (not illustrated) may be formed on the buffer layer 115. A gate insulating layer 130 may be formed on the first gate electrode precursor and the second semiconductor layer precursor.

Then, a metallic layer (not illustrated) may be deposited onto the gate insulating layer 130 and patterned to form a second gate electrode 245 and a plurality of etching stopper layers 243 and 244. The second gate electrode 245 may overlie a portion of the second semiconductor layer precursor. The plurality of etching stoppers 243 and 244 may be disposed external to, i.e., may not overlie, the first gate electrode precursor. Preferably, the etching stopper layers 243 and 244 do not overlie and the first gate electrode precursor so that it may be doped with impurities in a later process.

Then, impurities may be doped into the first gate electrode precursor and the second semiconductor layer precursor to form a first gate electrode 121 and a second semiconductor layer 125. The impurities may not pass through the etching stopper layers 243 and 244 and the second gate electrode 245.

The second semiconductor layer 125 may be demarcated into, e.g., a channel region 126 where the doping of impurities are intercepted by the second gate electrode 245 and source and drain regions 128 and 127 that are doped with impurities at respective sides of the channel region 126. The first gate electrode 121 may include an impurity-doped polycrystalline silicon layer, like the source and drain regions 128 and 127 of the second semiconductor layer 125. The arrows of FIG. 9 indicate the doping of impurities.

Figure 10:
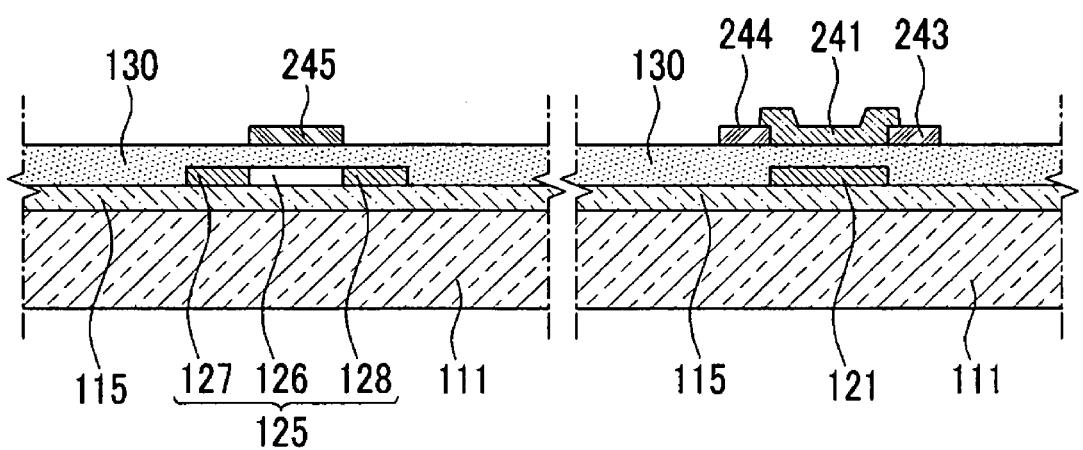

Then, as illustrated in FIG. 10, an oxide semiconductor layer may be formed on the plurality of etching stopper 243 and 244 and patterned to form a first semiconductor layer 241. The first semiconductor layer 241 may overlie the first gate electrode 121 with the gate insulating layer 130 interposed therebetween. The first semiconductor layer 241 may be disposed directly on and partially overlie the plurality of etching stoppers 243 and 244.

Figure 11:
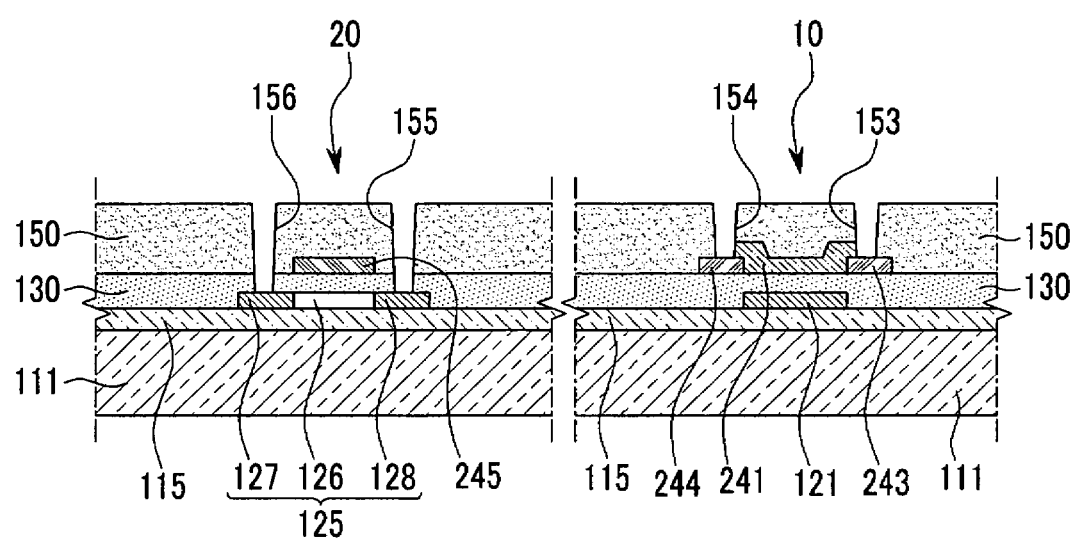

Then, as illustrated in FIG. 11, an interlayer insulating layer 150 may be formed on the first semiconductor layer 241, the etching stopper layers 243 and 244, and the second gate electrode 245. The interlayer insulating layer 150 may be etched to form a first source contact hole 153 and a first drain contact hole 154 partially exposing the first semiconductor layer 241 and the plurality of etching stopper layers 243 and 244, respectively. Furthermore, the interlayer insulating layer 150 and the gate insulating layer 130 may be etched together to form a second source contact hole 155 and a second drain contact hole 156 partially exposing the source and drain regions 128 and 127 of the second semiconductor layer 125, respectively. In an implementation, the contact holes 153, 154, 155, and 156 may be formed by a single etching process.

As illustrated in FIG. 8, a first source electrode 163, a first drain electrode 164, a second source electrode 165, and a second drain electrode 166 may be formed on the interlayer insulating layer 150 and in the contact holes 153, 154, 155, and 156.

The first source electrode 163 and the first drain electrode 164 may be directly and/or indirectly connected to the first semiconductor layer 241 via the first source and the first drain contact holes 153 and 154, and the etching stopper layers 243 and 244, respectively. That is, in the present embodiment, the first source electrode 163 and the first drain electrode 164 may be indirectly connected to the first semiconductor layer 241 via the etching stopper layers 243 and 244 or directly connected to the first semiconductor layer 241.

The second source electrode 165 and the second drain electrode 166 may be connected to the source and drain regions 128 and 127 of the second semiconductor layer 125 through the second source contact hole 155 and the second drain contact hole 156, respectively.

The organic light emitting diode display 102 according to the present embodiment may be effectively fabricated by conducting the above-described processes.

In the organic light emitting diode display according to an embodiment a polycrystalline silicon thin film transistor and the oxide thin film transistor are stably used together and are manufactured by a simple process.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting diode display, comprising:
   a substrate main body;
   a first gate electrode and a second semiconductor layer on the substrate main body;
   a gate insulating layer on the first gate electrode and the second semiconductor layer;
   a first semiconductor layer and a second gate electrode on the gate insulating layer, the first semiconductor layer overlying the first gate electrode and the second gate electrode overlying the second semiconductor layer;
   a plurality of etching stopper layers, the plurality of etching stopper layers contacting portions of the first semiconductor layer;
   an interlayer insulating layer on the first semiconductor layer and the second gate electrode, the interlayer insulating layer including a plurality of contact holes exposing the plurality of etching stopper layers, respectively;
   a first source electrode and a first drain electrode on the interlayer insulating layer and the contact holes, the first source electrode and the first drain electrode being indirectly connected to the first semiconductor layer via the plurality of etching stopper layers or directly connected to the first semiconductor layer; and
   a second source electrode and a second drain electrode on the interlayer insulating layer, the second source electrode and the second drain electrode being connected to the second semiconductor layer.

2. The organic light emitting diode display as claimed in claim 1, wherein the first semiconductor layer is an oxide semiconductor layer.

3. The organic light emitting diode display as claimed in claim 2, wherein the etching stopper layers are disposed external to the first semiconductor layer.

4. The organic light emitting diode display as claimed in claim 2, wherein the second semiconductor layer includes:
   a channel region under the second gate electrode, and
   source and drain regions at respective sides of the channel region.

5. The organic light emitting diode display as claimed in claim 4, wherein:
   the channel region of the second semiconductor layer includes a non-doped polycrystalline silicon layer, and
   the source and drain regions of the second semiconductor layer include an impurity-doped polycrystalline silicon layer.

6. The organic light emitting diode display as claimed in claim 5, wherein the first gate electrode includes the same material as, and is disposed in the same plane as, the source and drain regions of the second semiconductor layer.

7. The organic light emitting diode display as claimed in claim 4, wherein:
   the interlayer insulating layer and the gate insulating layer further include additional contact holes, the additional contact holes partially exposing the source and drain regions of the second semiconductor layer; and the second source electrode and second drain electrode are disposed in respective additional contact holes.

8. The organic light emitting diode display as claimed in claim 1, wherein the etching stopper layers are disposed directly on portions of the first semiconductor layer.

9. The organic light emitting diode display as claimed in claim 8, wherein the second gate electrode includes:
    a first electrode layer, the first electrode layer including the same material as the first semiconductor layer, and
    a second electrode layer, the second electrode layer including the same material as the etching stopper layer.

10. The organic light emitting diode display as claimed in claim 1, wherein portions of the first semiconductor layer are disposed directly on portions of the etching stopper layers.

11. The organic light emitting diode display as claimed in claim 10, wherein the second gate electrode includes the same material as the etching stopper layers.

12. A method of manufacturing an organic light emitting diode display, the method comprising:
    forming a first gate electrode precursor and a second semiconductor layer precursor on a substrate main body such that the first gate electrode precursor and the second semiconductor layer each include a polycrystalline silicon layer;
    forming a gate insulating layer on the first gate electrode precursor and the second semiconductor layer precursor;
    sequentially forming an oxide semiconductor layer and a metallic layer on the gate insulating layer;
    patterning the oxide semiconductor layer and the metallic layer to form a second gate electrode, a first semiconductor layer, and a plurality of etching stopper layers such that the plurality of etching stopper layers are disposed directly on portions of the first semiconductor layer;
    doping impurities into the first gate electrode precursor and the second semiconductor layer precursor to form a first gate electrode and a second semiconductor layer;
    forming an interlayer insulating layer on the second gate electrode, the first semiconductor layer, and the etching stopper layers;
    etching the interlayer insulating layer to form a first source contact hole and a first drain contact hole exposing the plurality of etching stopper layers, respectively; and
    etching the interlayer insulating layer and the gate insulating layer together to form a second source contact hole and a second drain contact hole partially exposing the second semiconductor layer.

13. The method as claimed in claim 12, further comprising forming a first source electrode, a first drain electrode, a second source electrode, and a second drain electrode on the interlayer insulating layer, and wherein:
    the first source electrode and the first drain electrode are directly connected to the first semiconductor layer via the first source and first drain contact holes or indirectly connected to the first semiconductor layer via the etching stopper layers, and
    the second source electrode and the second drain electrode are connected to the second semiconductor layer through the second source contact hole and the second drain contact hole, respectively.

14. The method as claimed in claim 13, wherein the etching stopper layers are disposed external to the first semiconductor layer.

15. The method as claimed in claim 13, wherein the second semiconductor layer includes:
    a channel region, the channel region being disposed under the second gate electrode, and
    source and drain regions, the source and drain regions being disposed at respective sides of the channel region.

16. The method as claimed in claim 15, wherein the channel region of the second semiconductor layer includes a non-doped polycrystalline silicon layer and the source and drain regions of the second semiconductor layer include an impurity-doped polycrystalline silicon layer.

17. The method as claimed in claim 16, wherein the first gate electrode is formed in the same way as, in the same plane as, and of the same material as the source and drain regions of the second semiconductor layer.

18. The method as claimed in claim 12, wherein the second gate electrode includes a double-layered structure formed from the oxide semiconductor layer and the metallic layer, wherein the first semiconductor layer is formed from the oxide semiconductor layer, and wherein the etching stopper layers are formed from the metallic layer.

19. A method of manufacturing an organic light emitting diode display, the method comprising:
    forming a first gate electrode precursor and a second semiconductor layer precursor on a substrate main body such that the first gate electrode precursor and second semiconductor layer precursor include a polycrystalline silicon layer;
    forming a gate insulating layer on the first gate electrode precursor and the second semiconductor layer precursor;
    forming a metallic layer on the gate insulating layer;
    patterning the metallic layer to form a second gate electrode and a plurality of etching stopper layers;
    doping impurities into the first gate electrode precursor and the second semiconductor layer precursor to form a first gate electrode and a second semiconductor layer;
    forming an oxide semiconductor layer on the plurality of etching stopper layers;
    patterning the oxide semiconductor layer to form a first semiconductor layer such that portions of the first semiconductor layer at least partially overlie portions of the etching stopper layers;
    forming an interlayer insulating layer on the second gate electrode, the etching stopper layers, and the first semiconductor layer;
    etching the interlayer insulating layer to form a first source contact hole and a first drain contact hole such that the first source contact hole and the first drain contact hole expose the plurality of etching stopper layers, respectively; and
    etching the interlayer insulating layer and the gate insulating layer together to form a second source contact hole and a second drain contact hole such that the second source contact hole and a second drain contact hole partially expose the second semiconductor layer.

20. The method as claimed in claim 19, further comprising forming a first source electrode, a first drain electrode, a second source electrode, and a second drain electrode on the interlayer insulating layer, and wherein:
    the first source electrode and the first drain electrode are directly connected to the first semiconductor layer via the first source and first drain contact holes or indirectly connected to the first semiconductor layer via the etching stopper layers, and
    the second source electrode and the second drain electrode are connected to the second semiconductor layer through the second source contact hole and the second drain contact hole, respectively.

21. The method as claimed in claim 20, wherein the etching stopper layers are disposed external to the first semiconductor layer.

22. The method as claimed in claim 20, wherein the second semiconductor layer includes:
 a channel region, the channel region being disposed under the second gate electrode, and
 source and drain regions, the source and drain regions being disposed at respective sides of the channel region.

23. The method as claimed in claim 22, wherein the channel region of the second semiconductor layer includes a non-doped polycrystalline silicon layer and the source and drain regions of the second semiconductor layer include an impurity-doped polycrystalline silicon layer.

24. The method as claimed in claim 23, wherein the first gate electrode is formed in the same way as, in the same plane as, and of the same material as the source and drain regions of the second semiconductor layer.

* * * * *